US011527561B2

(12) United States Patent
Zhan et al.

(10) Patent No.: US 11,527,561 B2
(45) Date of Patent: Dec. 13, 2022

(54) PHOTOSENSITIVE SEMICONDUCTOR DEVICE INCLUDING TOP SURFACE PHOTODIODE

(71) Applicant: UNITED MICROELECTRONICS CORP., Hsin-Chu (TW)

(72) Inventors: Zhaoyao Zhan, Singapore (SG); Qianwei Ding, Singapore (SG); Xiaohong Jiang, Singapore (SG); Ching Hwa Tey, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 167 days.

(21) Appl. No.: 16/931,400

(22) Filed: Jul. 16, 2020

(65) Prior Publication Data
US 2021/0384231 A1    Dec. 9, 2021

(30) Foreign Application Priority Data

Jun. 5, 2020    (CN) .......................... 202010503994.4

(51) Int. Cl.
*H01L 27/146*    (2006.01)

(52) U.S. Cl.
CPC .... *H01L 27/1461* (2013.01); *H01L 27/14623* (2013.01)

(58) Field of Classification Search
CPC ........... H01L 27/1461; H01L 27/14643; H01L 27/14623; H01L 27/14621; H01L 27/14627; H01L 27/14636; H01L 27/14665; H01L 27/14634; H01L 27/14603; H01L 27/14683
See application file for complete search history.

(56) References Cited

U.S. PATENT DOCUMENTS

| | | | |
|---|---|---|---|
| 6,943,051 | B2 | 9/2005 | Augusto |
| 7,153,720 | B2 | 12/2006 | Augusto |
| 7,432,578 | B1 | 10/2008 | Chung |
| 9,882,074 | B2 | 1/2018 | Yang |
| 9,964,846 | B2 | 5/2018 | Geohegan |
| 10,367,028 | B2 | 7/2019 | Chen |
| 10,468,548 | B2 | 11/2019 | Sachet |
| 2016/0197116 | A1 | 7/2016 | Ikeda |
| 2018/0144849 | A1 | 5/2018 | Jonker |
| 2018/0240797 | A1 | 8/2018 | Yokoyama |
| 2019/0277703 | A1 | 9/2019 | Valouch |
| 2020/0003899 | A1 | 1/2020 | Lungenschmied |
| 2020/0135776 | A1* | 4/2020 | Finkelstein ........... G01S 17/894 |

OTHER PUBLICATIONS

Yexin Deng, Black Phosphorus-Monolayer MoS2 van der Waals Heterojunction p-n Diode, ACS Nano, vol. 8, No. 8, p. 8292-8299 (Year: 2014).*

* cited by examiner

*Primary Examiner* — Nelson Garces
(74) *Attorney, Agent, or Firm* — Winston Hsu (57) ABSTRACT

A photosensitive device is disclosed, including an integrated circuit structure, a first pad and a second pad exposed from a surface of the integrated circuit structure, a first material layer disposed on the surface of the integrated circuit structure and covering the first pad, and a second material layer disposed on the first material layer and covering the second pad. The first material layer and the second material layer form a photodiode.

15 Claims, 10 Drawing Sheets

PHOTOSENSITIVE SEMICONDUCTOR DEVICE INCLUDING TOP SURFACE PHOTODIODE

BACKGROUND OF THE INVENTION

1. Field of the Invention

The invention relates to a photosensitive device and method for forming the same. More particularly, the invention relates to a complementary metal-oxide semiconductor (CMOS) image sensor (CIS) and method for forming the same.

2. Description of the Prior Art

The complementary metal-oxide semiconductor (CMOS) image sensor (CIS) is a kind of photosensitive device that is compatible with the manufacturing process of the complementary metal-oxide semiconductor (CMOS) transistor and may be made integrally with the associated peripheral circuits on the same chip, which may greatly reduce the manufacturing cost and the power consumption during operation. Due to the above advantages, CIS has been widely used in many consumer and professional applications.

In general, a CMOS image sensor may be classified into a FSI (front side illumination) image sensor and a BSI (back side illumination) image sensor. In a conventional FSI CMOS image sensor, the lights are incident on the front side of the chip (the front side of the substrate) and will have to pass through the interconnection layer on the substrate to be received by the photodiode (PD) pofrions formed in the substrate for being converted into electrical signals. However, during the above process, a portion of the lights may be blocked, reflected or absorbed by the interconnection layer, which may result in reduced light sensitivity or increased crosstalk noise. In a conventional BSI CMOS image sensor, the lights are incident on the back side of the chip (back side of the substrate) and therefore the aforesaid problems encountered in the FSI design may be avoided. However, there are still problems for BSI design, such as parasitic light sensitivity caused by light scattering on the substrate.

Moreover, due to the photodiodes of conventional FSI or BSI CMOS image sensors are formed in the substrate, the miniaturization of the pixel units may be restricted for maintaining sufficient photosensitive areas of the photodiodes.

SUMMARY OF THE INVENTION

In light of the above, the present invention is directed to provide a novel photosensitive device which may provide enhanced light sensitivity, faster respond speed and reduced noise.

According to an embodiment of the present invention, a photosensitive device is disclosed. The photosensitive device includes an integrated circuit structure, a first pad and a second pad exposed from a surface of the integrated circuit structure, a first material layer disposed on the surface of the integrated circuit structure and covering the first pad, and a second material layer disposed on the first material layer and covering the second pad, wherein the first material layer and the second material layer form a photodiode.

According to another embodiment of the present invention, a photosensitive device is disclosed. The photosensitive device includes an array region comprising a plurality of pixel units. Each pixel unit includes a first pad and a second pad exposed from a surface of the pixel unit, a first material layer disposed on the surface of the pixel unit and covering the first pad, and a second material layer disposed on the first material layer and covering the second pad, wherein the first material layer and the second material layer form a photodiode.

According to still another embodiment of the present invention, a method for forming a photosensitive device is disclosed, which includes the steps of providing an integrated circuit structure having a first pad and a second pad exposed from a surface of the integrated circuit structure, forming a first material layer on the surface of the integrated circuit structure, patterning the first material layer to expose the second pad, forming a second material layer on the first material layer and covering the second pad, and patterning the second material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1A, FIG. 1B, FIG. 2A, FIG. 2B, FIG. 3A, FIG. 3B, and FIG. 4 are schematic drawings showing a portion of a photosensitive device at different steps of a manufacturing process according to one embodiment of the present invention, wherein FIG. 1A, FIG. 2A, FIG. 3A, FIG. 4 are schematic cross-sectional views, the upper-left portions of FIG. 1B, FIG. 2B, FIG. 3B are schematic perspective views, and the lower-right portions of FIG. 1B, FIG. 2B and FIG. 3B are schematic top views.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The terms "wafer" and "substrate" used herein include any structure having an exposed surface onto which a layer is deposited according to the present invention, for example, to form the circuit structure. The term substrate is understood to include semiconductor wafers, but not limited thereto. The term substrate is also used to refer to semiconductor structures during processing, and may include other layers that have been fabricated thereupon.

Figure 1A:
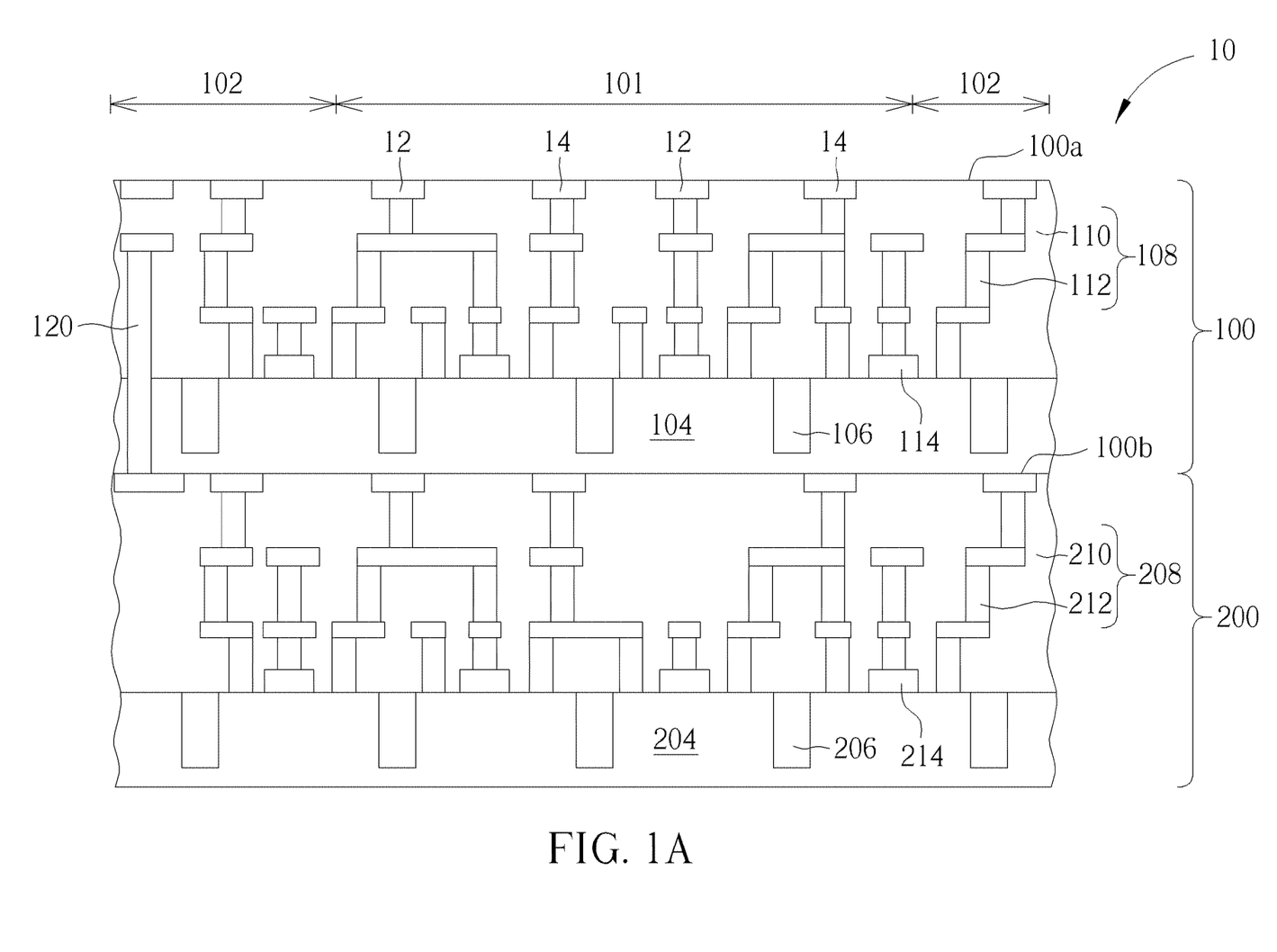
Figure 1B:
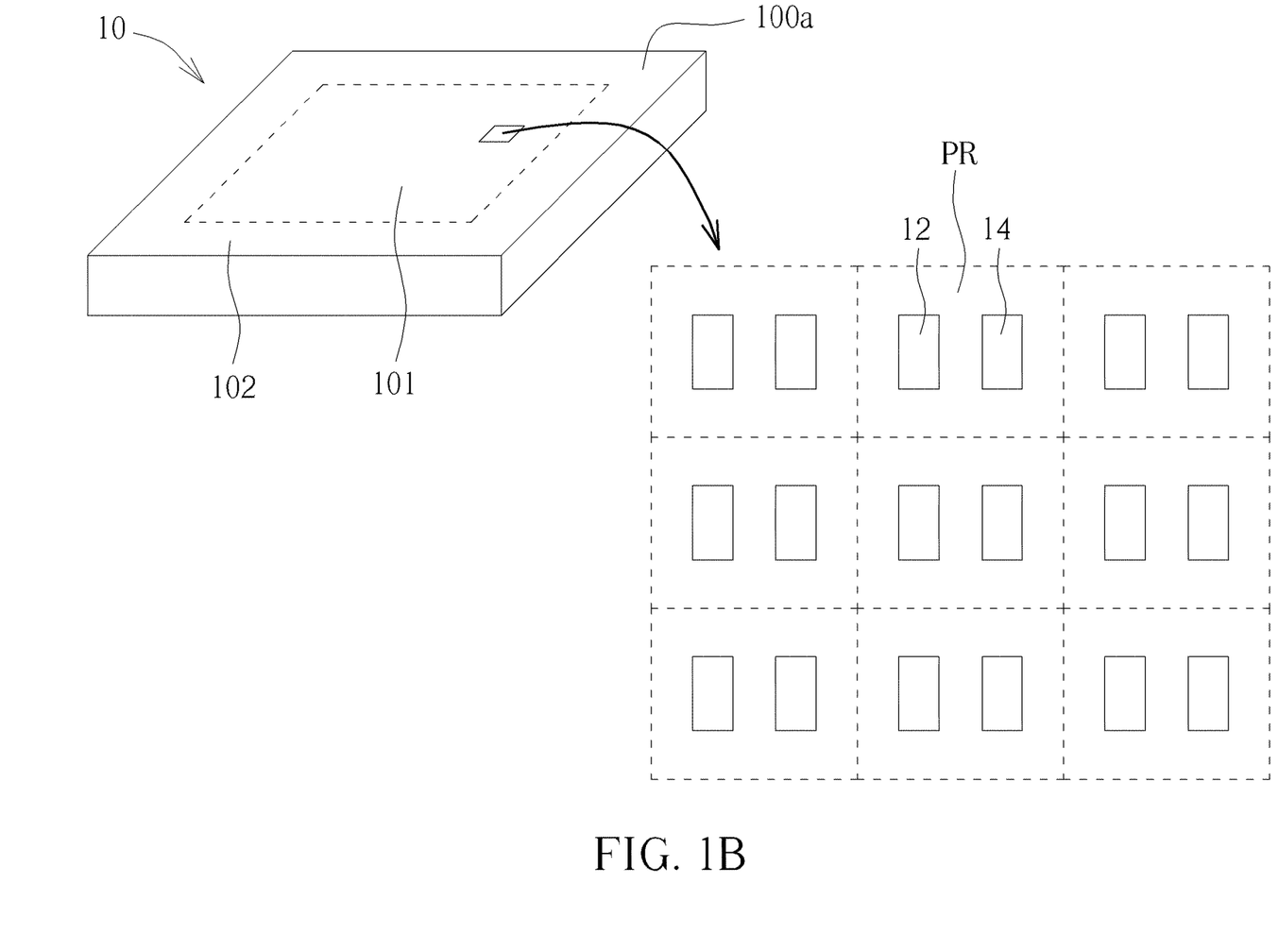
Figure 2A:
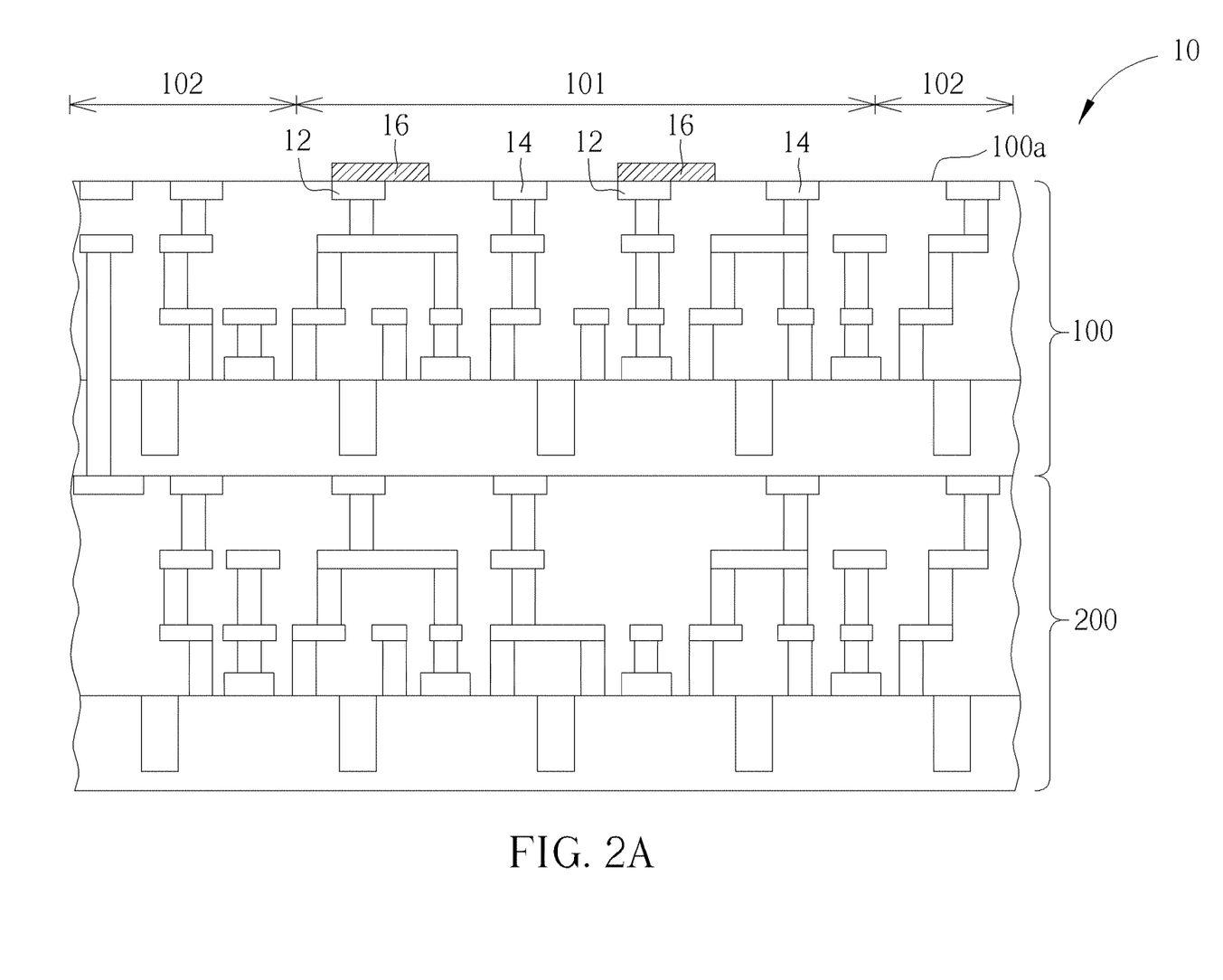
Figure 2B:
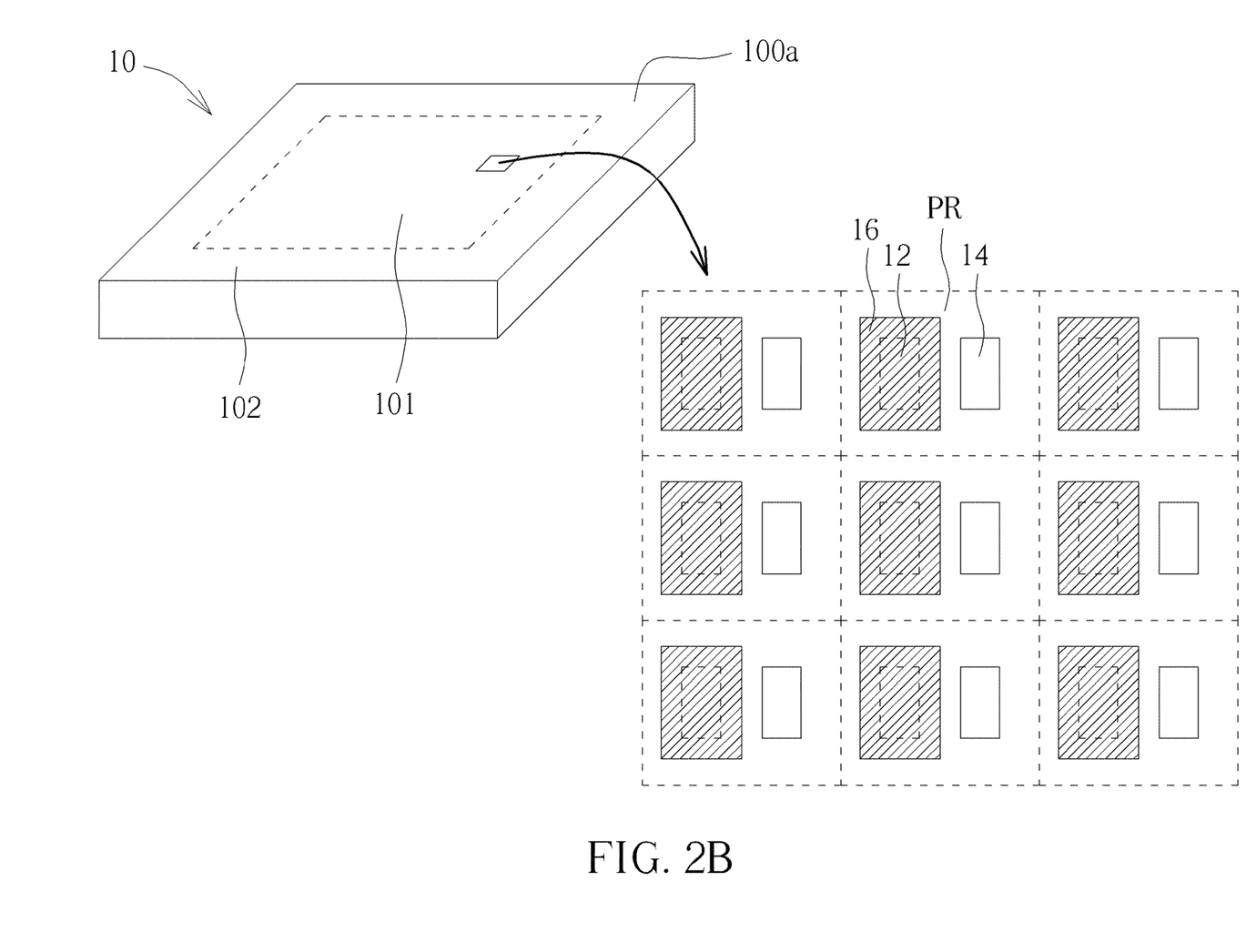
Figure 3A:
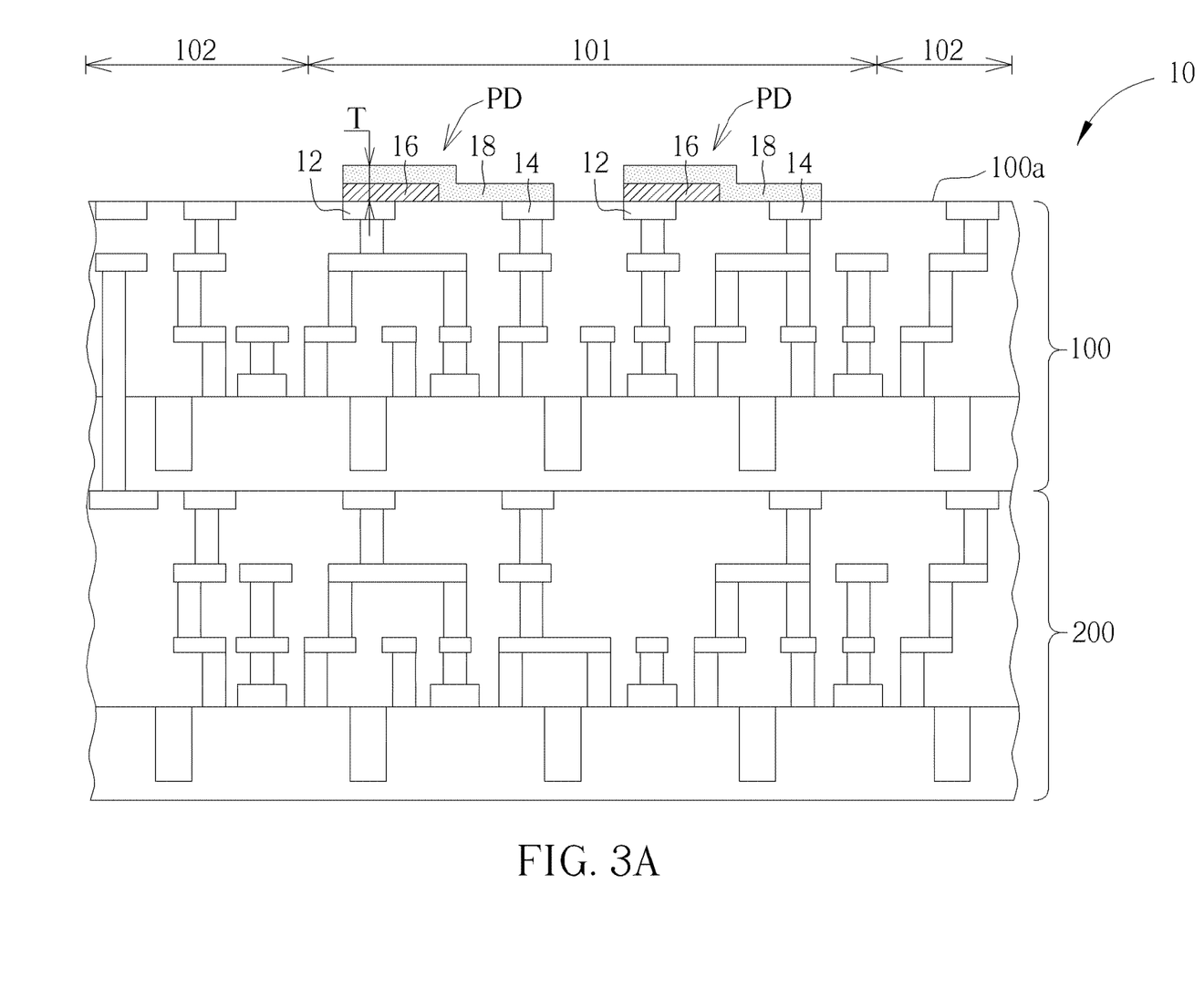
Figure 3B:
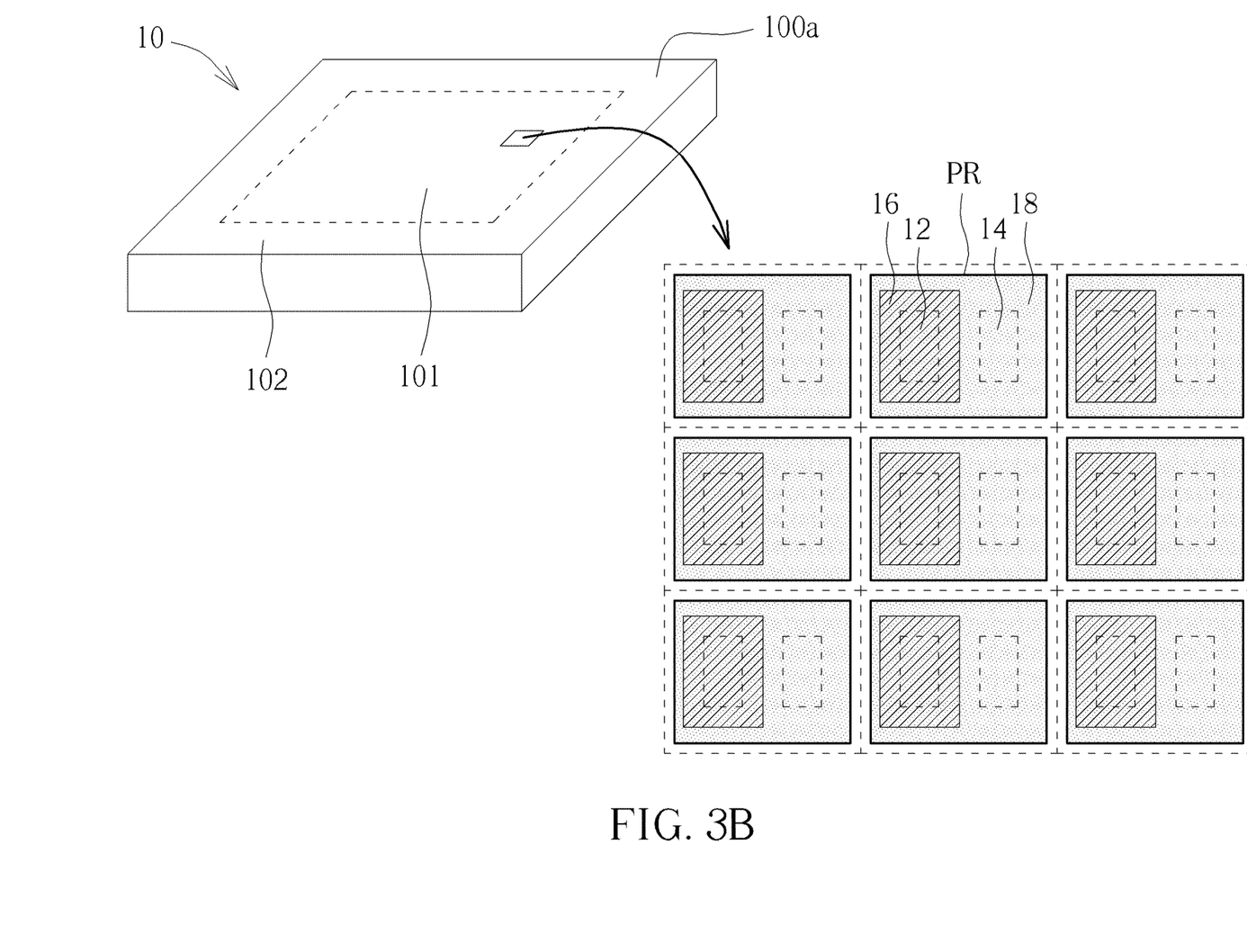

FIG. 1A, FIG. 1B, FIG. 2A, FIG. 2B, FIG. 3A, FIG. 3B, and FIG. 4 are schematic drawings showing a portion of a photosensitive device at different steps of a manufacturing process according to one embodiment of the present invention, wherein FIG. 1A, FIG. 2A, FIG. 3A, FIG. 4 are schematic cross-sectional views of the photosensitive device, the upper-left portions of FIG. 1B, FIG. 2B, FIG. 3B are schematic perspective views of the photosensitive device, and the lower-right portions of FIG. 1B, FIG. 2B and FIG. 3B are schematic top views showing a portion of a pixel array region of the photosensitive device.

Please refer to FIG. 1A and FIG. 1B. The method for manufacturing a photosensitive device 10 according to the embodiment includes providing an integrated circuit structure 100. The integrated circuit structure 100 may include a substrate 104, a plurality of isolation structures 106 formed in the substrate 104, a plurality of semiconductor devices 114 formed on and/or in the substrate 104, and an interconnection layer 108 formed on the substrate 104. In some embodiments, the substrate 104 may be a silicon substrate, a silicon-on-insulator (SOI) substrate, a Group III-V semiconductor substrate, but not limited thereto. The isolation structure 106 may be a shallow trench insulation (STI) structure that include dielectric materials such as silicon oxide ($SiO_2$), silicon nitride (SiN), or silicon oxynitride (SiON), but not limited thereto. The semiconductor device 114 may include transistors, diodes, memory, rectifiers, amplifiers, resistors, capacitors, inductors, or other semiconductor devices, but not limited thereto. The interconnection layer 108 may include an interlayer dielectric layer 110 and a plurality of interconnecting structures 112 formed in the interlayer dielectric layer 110. In some embodiments, the interlayer dielectric layer 110 may include dielectric materials such as silicon oxide ($SiO_2$), silicon oxynitride (SiON), silicon nitride (SiN), low-k dielectric materials such as fluorinated silica glass (FSG), silicon oxycarbide (SiCOH), spin on glass, porous low-k dielectric material, or organic dielectric polymers, but not limited thereto. The interlayer dielectric layer 110 may include a multi-layer structure, which is not shown in the drawings for simplicity. The interconnecting structures 112 are formed in the interlayer dielectric layer 110 and may include conductive lines (such as metal traces) and contact plugs. The interconnecting structures 112 may include metal materials such as aluminum (Al), copper (Cu), gold (Au), silver (Ag), chromium (Cr), titanium (Ti), tantalum (Ta), tungsten (W), niobium (Nb), molybdenum (Mo), alloys or compounds of the above materials, but not limited thereto.

As shown in the upper-left portion of FIG. 1B, the integrated circuit structure 100 may include an array region 101 and a peripheral region 102 surrounding the array region 101. As shown in the lower-right portion of FIG. 1B, the array 101 region includes a plurality of pixel units PR, which are photosensitive areas of the photosensitive device 10 that receives the lights. The peripheral region 102 may include interconnecting structures connected to signal read-out circuits or signal processing circuits of the integrated circuit structure 100 for controlling and reading signals from the array region 101. The integrated circuit structure 100 may further include circuit elements such as, for example, transfer gates, source followers, reset transistors, row select transistors, floating diffusions, amplifiers, and other electronic elements, but not limited thereto. It should be understood that the shape of the photosensitive device 10, the shape of the array region 101, the shape of the peripheral region 102, and the shape of the pixel units PR shown in FIG. 1B are only examples. The photosensitive device 10, the array region 101, the peripheral region 102 and the pixel units PR may have other shapes in other embodiments.

As shown in FIG. 1A and the lower-right portion of FIG. 1B, a first pad 12 and a second pad 14 of each of the pixel units PR are exposed from the surface (the upper surface) 100a of the integrated circuit structure 100. The first pad 12 and the second pad 14 are electrically connected to the interconnecting structure 112 of the interconnection layer 108. The first pad 12 and a second pad 14 may include metal materials such as aluminum (Al), copper (Cu), gold (Au), silver (Ag), chromium (Cr), titanium (Ti), tantalum (Ta), tungsten (W), niobium (Nb), molybdenum (Mo), alloys or compounds of the above materials, but not limited thereto.

In some embodiments, the photosensitive device 10 may have a three three-dimensional (3D) stacked structure. For example, as shown in FIG. 1A, another integrated circuit structure 200 may be bonded to another surface (the lower surface) 100b that is opposite to the surface 100a of the integrated circuit structure 100. In some embodiments, the integrated circuit structure 200 may include logic circuits or memory circuits, and may also include analog-to-digital converters, such as A/D converters or D/A converters, but not limited thereto. In some embodiments, the integrated circuit structure 200 may include a substrate 204, a plurality of isolation structures 206 formed in the substrate 204, a plurality of semiconductor devices 214 formed on and/or in the substrate 204, and an interconnection layer 208 formed on the substrate 204. The interconnection layer 208 may include an interlayer dielectric layer 210 and a plurality of interconnecting structures 212 formed in the interlayer dielectric layer 210.

In some embodiments, at least a through-silicon via (TSV) 120 may be used to electrically connect the integrated circuit structure 100 and the integrated circuit structure 200. In some embodiments, an intermediate layer (not shown) including bonding pad and/or redistribution layers (RDL) may be disposed between the integrated circuit structure 100 and the integrated circuit structure 200.

Please refer to FIG. 2A and FIG. 2B. Subsequently, a first material layer 16 is formed on the surface 100a of the integrated circuit structure 100 and is patterned so that each patterned first material layer 16 is completely within one of the pixel unit PR and covers the first pad 12 of the pixel unit PR while exposes the second pad 14 of the pixel unit PR.

Please refer to FIG. 3A and FIG. 3B. After patterning the first material layer 16, a second material layer 18 is formed on the surface 100a of the integrated circuit structure 100 and overlaps on the first material layer 16. The second material layer 18 is then patterned so that each patterned second material layer 18 is completely within one of the pixel unit PR and covers the first material layer 16 and the second pad 14 of the pixel unit PR. In some embodiments, the first material layer 16 is completely covered by the second material layer 18. In some embodiments, as shown in FIG. 3A, a top surface and a sidewall of the first material layer 16 are covered by the second material layer 18. The bottom surface of the first material layer 16 and the bottom surface of the second material layer 18 are flush with each other and are both in contact with the surface 100a of the integrated circuit structure 100. In some embodiments, the area of the second material layer 18 is between approximately 70% and 100% of the area of the pixel unit PR. It should be understood that the shape of the patterned first material layer 16 and the shape of the patterned second material layer 18 shown in the lower-right portion of FIG. 3B are only examples. In other embodiments, the first material layer 16 and the second material layer 18 may be patterned into other shapes according to design needs.

In some embodiments, the first material layer 16 and the second material layer 18 respectively include a semiconductor material having opposite conductivity types. For example, the first material layer 16 may be P-type and the second material layer 18 may be N-type. On the contrary, the first material layer 16 may be N-type and the second material layer 18 may be P-type. The first material layer 16 and the second material layer 18 overlapped thereon may form a photodiode PD of the photosensitive device 10. The p-n junction between the first material layer 16 and the second material layer 18 may have an energy band gap that absorbs a particular spectrum of light and generates corresponding electrical signals.

In some embodiments, the first material layer 16 and the second material layer 18 may respectively include a two-dimensional (2D) material layer and may have a single-layer or a multiple-layer structure. Suitable two-dimensional materials for forming the first material layer 16 and/or the second material layer 18 may include, for example, graphene, silicene, germanene, stanene, phosphorene, borophene, hexagonal boron nitride (h-BN), transition metal chalcogenides (TMDs), transition metal carbon (nitrogen) compounds (MXenes), transition metal oxides (TM oxides), hydroxides (hydroxides), but not limited thereto.

The first material layer 16 and the second material layer 18 may be formed on the surface 100a of the integrated circuit structure 100 by any suitable method. In some embodiments, the first material layer 16 and the second material layer 18 may be respectively formed on starting substrates in advance and then be successively transferred from the starting substrates to the surface 100a of the integrated circuit structure 100 using, for example, transfer printing technology. In other embodiments, the first material layer 16 and the second material layer 18 may be directly formed on the surface 100a of the integrated circuit structure 100 by, for example, performing suitable chemical vapor deposition processes.

In some embodiments of the present invention, the first material layer 16 and the second material layer 18 may respectively include a binary or multinary transition metal chalcogenide. For example, suitable materials for the first material layer 16 and/or the second material layer 18 may include transition metal dichalcogenides (TMDs), such as $MoS_2$, $MoSe_2$, $WS_2$, $WSe_2$, $MoTe_2$, $WTe_2$, $ZrS_2$, $ZrSe_2$, GaSe, GaTe, InSe, $Bi_2Se_3$, $VSe_2$, $NbSe_2$, $TaS_2$, $TiS_2$, $TiSe_2$, $TiTe_2$, but not limited thereto.

In some embodiments of the present invention, the first material layer 16 may include $WSe_2$, and the second material layer 18 may include $MoS_2$. In some embodiments of the present invention, the first material layer 16 and the second material layer 18 may respectively have a thickness between 0.3 and 0.6 nanometers (nm), but not limited thereto. In some embodiments, the first material layer 16 and the second material layer 18 are partially overlapped with each other and form a photodiode PD having a heterojunction interface. In some embodiments, the thickness T of the overlapped region of the first material layer 16 and the second material layer 18 is about 1 nm, but not limited thereto.

One feature of the present invention is that, in comparison with conventional photosensitive device having photodiodes formed in the substrate using, for example, ion implantation processes, the photosensitive device 10 provided by the present invention has photodiodes PD formed over the substrate by overlapping the first material layer 16 and the second material layer 18 that are made of two-dimensional materials. In this way, the width of the space charge region of the photodiode PD may be smaller. Therefore, the carrier transfer time of the photosensitive device 10 may be reduced and the response speed may be improved. In other embodiments of the present invention, one or more semiconductor layers or dielectric material layers may be disposed between the first material layer 16 and the second material layer 18 to improve performance.

Figure 4:
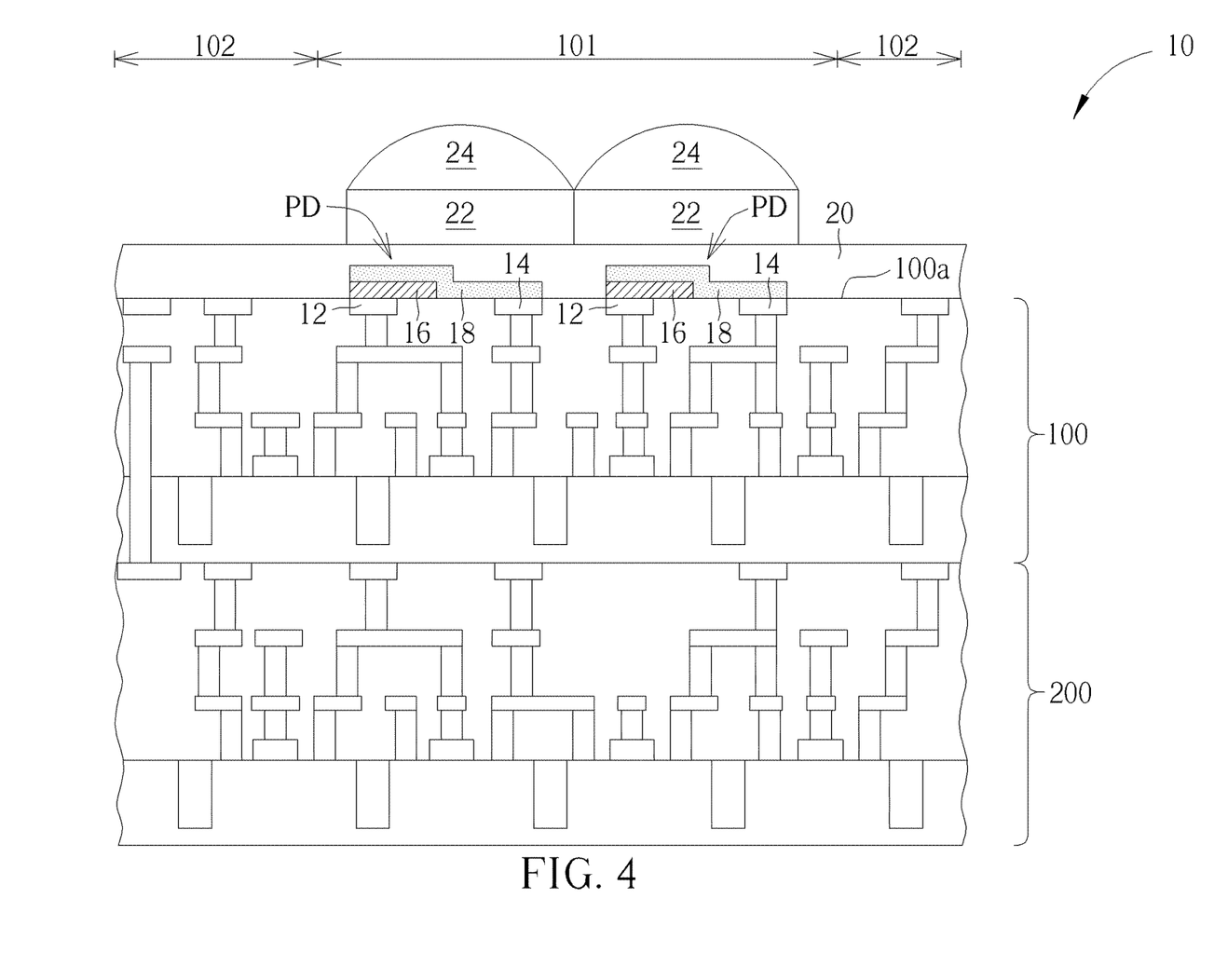

In some embodiments of the present invention, as shown in FIG. 4, an anti-reflective layer 20 may be subsequently formed on the surface 100a of the integrated circuit structure 100 and covering the first material layer 16 and the second material layer 18. A color filter layer 22 and a microlens 24 corresponding to each pixel unit PR are then formed on the anti-reflective layer 20 and aligned with the photodiode PD of each pixel unit. The anti-reflective layer 20 may include conventional anti-reflective materials, such as silicon oxide, silicon nitride, or silicon oxynitride, but not limited thereto. The color filter layer 22 may include a chromatic material that allows a particular color (such as red, green or blue) of the incident lights to pass, but not limited thereto. The color filter layer 22 makes the pixel unit PR corresponding to a specific color. The microlens 24 is used to focus the incident light onto the photodiode PD and may improve the sensitivity of the photosensitive device 10. In some embodiments, a planarization layer (not shown) may be disposed between the color filter layer 22 and the microlens 24 to facilitate the fabrication of the microlens 24. In some embodiments, a reflective layer (not shown) may be disposed between adjacent photodiodes PD to reduce light scattering or light leakage to adjacent photodiodes PD so as to reduce interference or crosstalk noise between adjacent pixel units PR. The reflective layer may include a dielectric material or a metal material, but not limited thereto.

Figure 5:
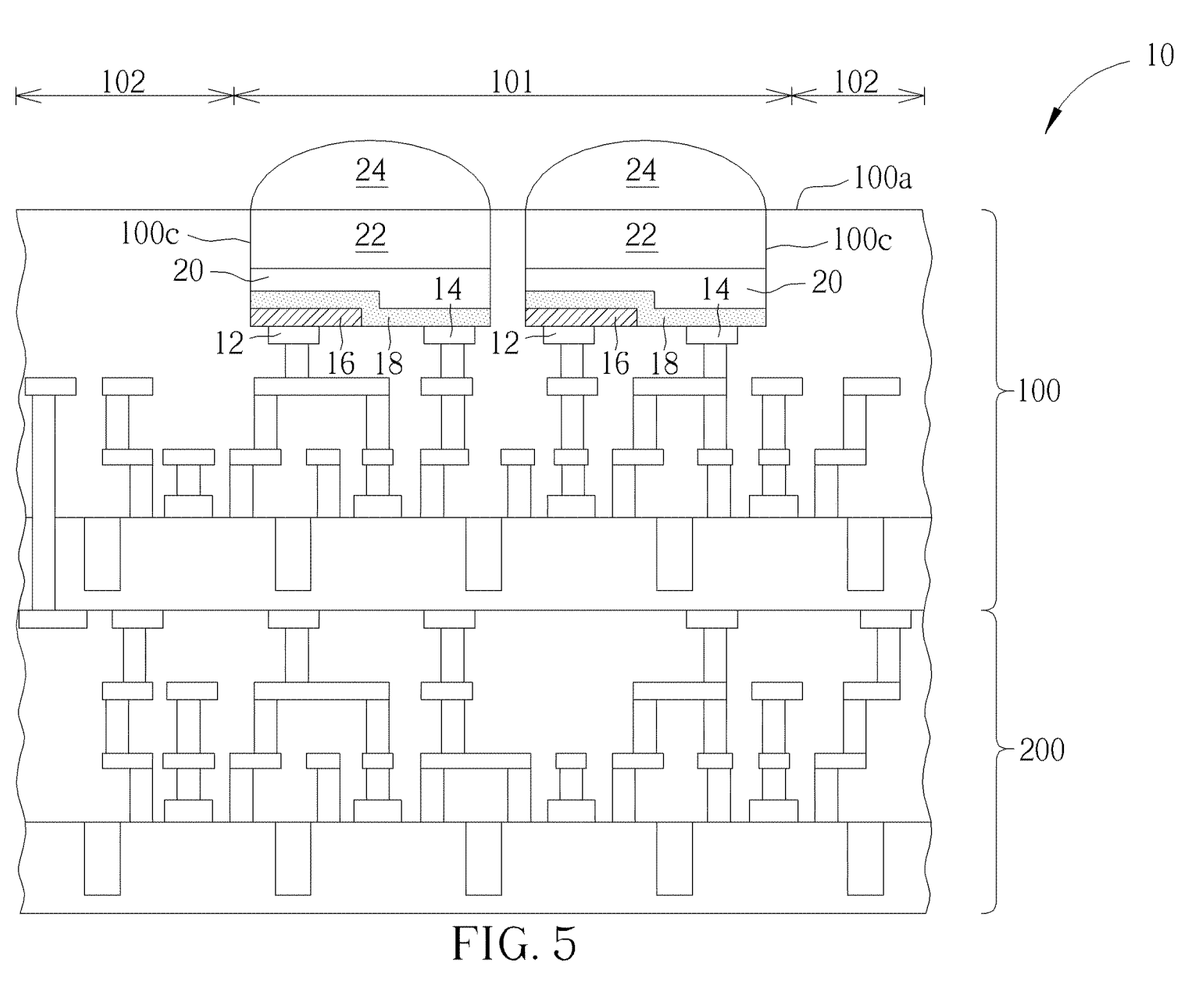
FIG. 5 and FIG. 6 are schematic cross-sectional drawings illustrating a portion of the photosensitive device according to some embodiments of the present invention.
Figure 6:
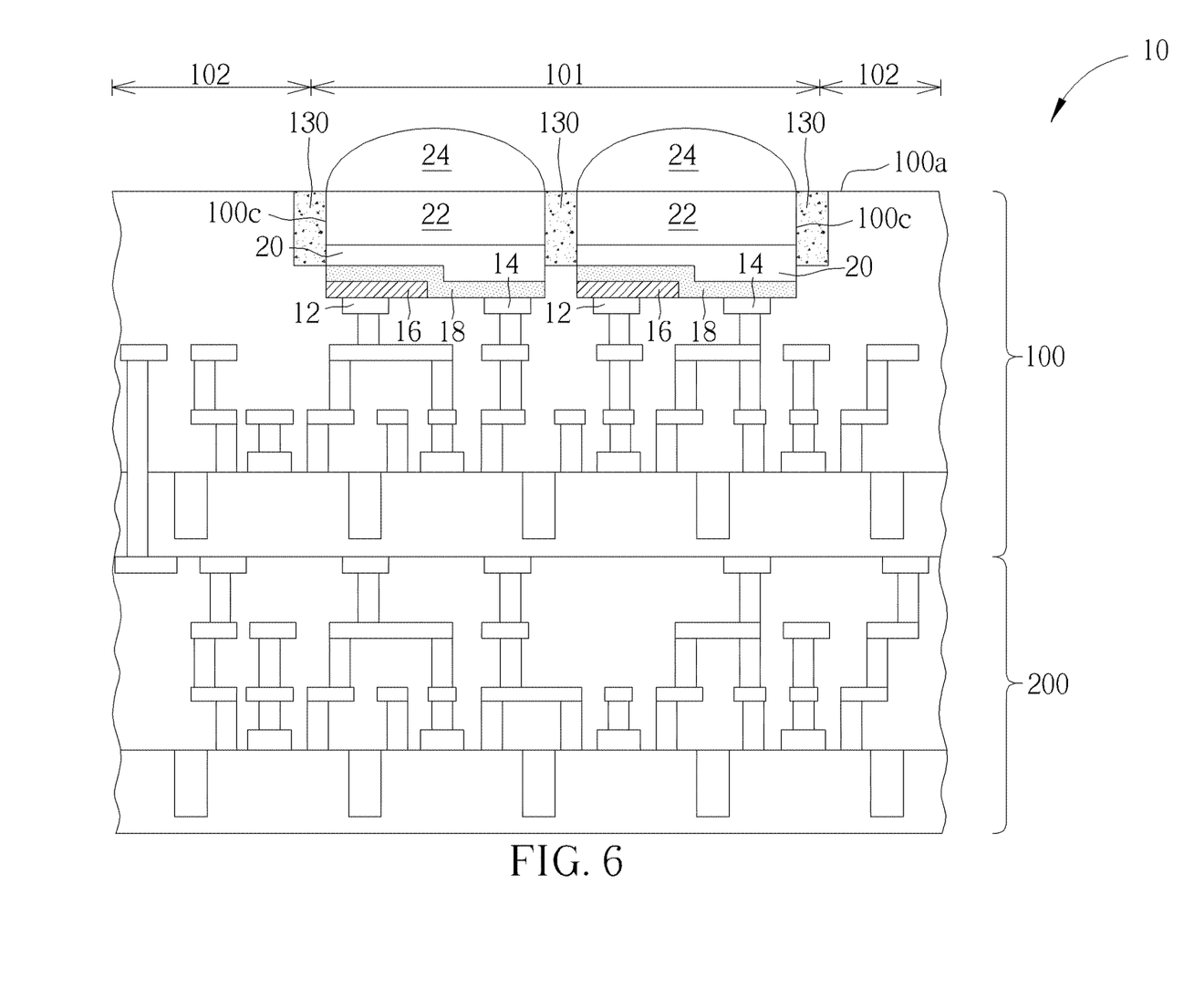

Please refer to FIG. 5 and FIG. 6, which are schematic cross-sectional drawings illustrating a portion of the photosensitive device according to some embodiments of the present invention. In order to simplify the description, like reference symbols are used to denote the same material layers or structures shown in FIG. 4, FIG. 5 and FIG. 6. In the embodiment shown in FIG. 5, the surface 100a of the integrated circuit structure 100 may include a plurality of recessed areas 100c respectively corresponding to one of the pixel units PR, and the first pad 12 and the second pad 14 of the pixel units PR are exposed from the recessed areas 100c. The first material layer 16, the second material layer 18, the anti-reflective layer 20, and the color filter layer 22 of the pixel units PR may be formed in the recessed areas 100c. In a preferred embodiment, the interlayer dielectric layer 110 between adjacent recessed regions 100c may have a proper reflectivity to reduce interference between adjacent pixel units PR caused by light scattering or light leakage. In another embodiment as shown in FIG. 6, a reflective layer 130 may be disposed between adjacent photodiodes PD to reduce light scattering or leakage on adjacent photodiodes PD to reduce interference and crosstalk noise between adjacent pixel units PR. The reflective layer 130 may include a dielectric material or a metal material, but is not limited thereto.

Figure 7:
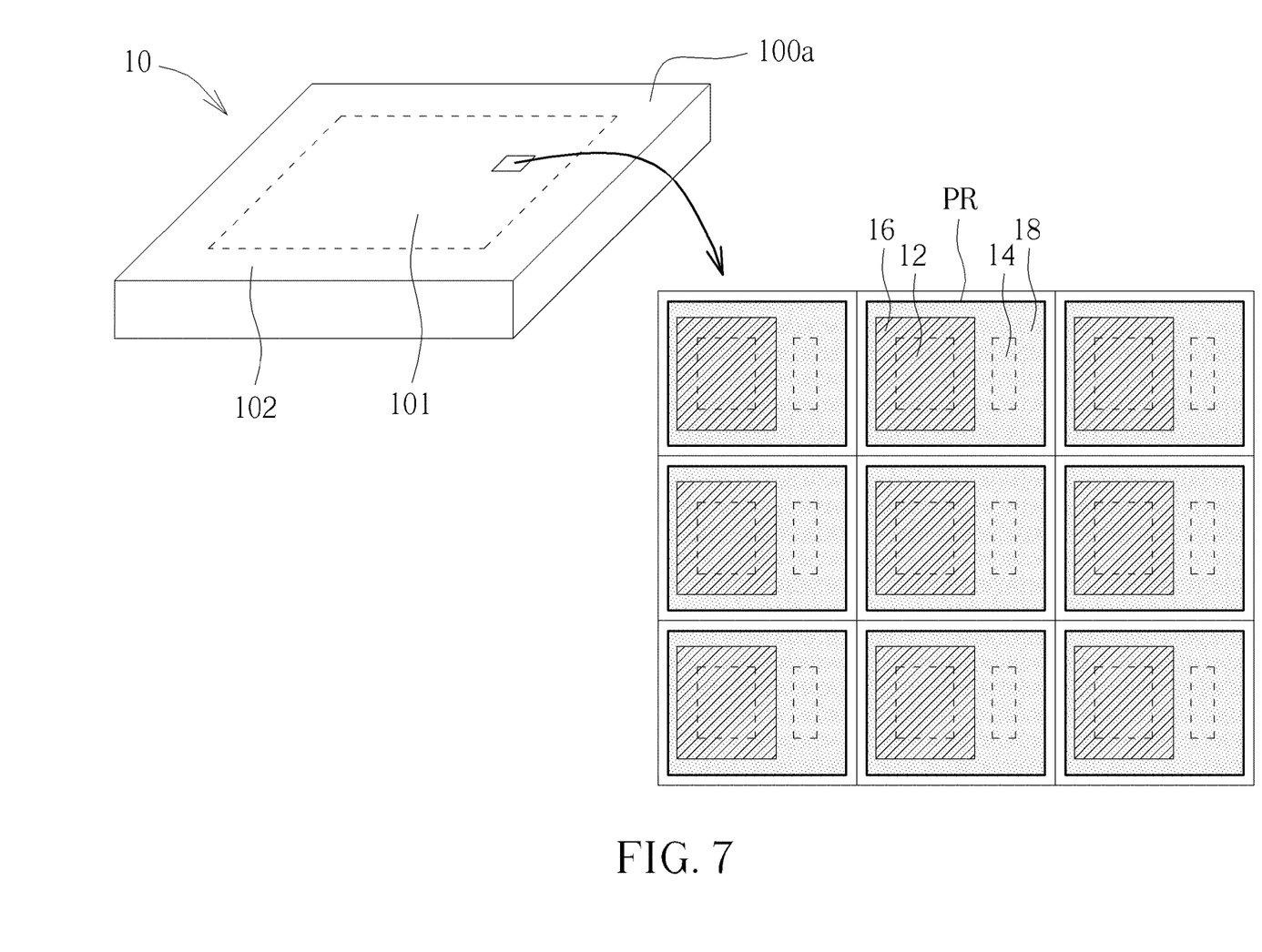
FIG. 7 is a schematic drawing illustrating a portion of a photosensitive device according to one embodiment of the present invention. The upper-left portion of FIG. 7 is a schematic perspective view. The lower-right portion of FIG. 7 is a schematic top view.

Please refer to FIG. 7, which is a schematic drawing illustrating a photosensitive device according to one embodiment of the present invention. The upper-left portion of FIG. 7 is a schematic perspective view. The lower-right portion of FIG. 7 is a schematic top view. In order to simplify the description, like reference symbols are used to denote the same material layers or structures in FIG. 3B and FIG. 7. In the embodiment of FIG. 7, the first pad 12 and the second pad 14 may have different areas. For example, the ratio of the areas of the first pad 12 and the second pad 14 may be adjusted (still within the region of the pixel units PR) according to the contact resistance between the first material layer 16 and the first pad 12 and the contact resistance between the second material layer 18 and the second pad 14 to achieve an appropriate proportion of the contact resistances and therefore improved performance. In some embodiments, when the contact resistance between the first material layer 16 and the first pad 12 is greater than the contact resistance between the second material layer 18 and the second pad 14, the area of the first pad 12 may be increased to increase the contacting area of the first material layer 16 and the first pad 12, and the area of the second pad 14 may be decreased to decrease the contacting area of the second material layer 18 and the second pad 14. Accordingly, the difference between the contact resistances between the first pad 12 and the second pad 14 may be reduced. In some embodiment, the area of the first pad 12 is larger than an area of the second pad 14 from a top view.

In summary, the photosensitive device provided by the present invention has the photodiodes formed on the surface of the interconnection layer over the substrate, such that the photosensitive area (the area of the photodiode) of each pixel unit may be designed without being limited by the semiconductor device formed in the substrate or the interconnecting structures of the interconnection layers. A larger filling factor may be achieved. Furthermore, the photosensitive device provided by the present invention may have improved sensitivity and reduced crosstalk noise because that the incident lights may be received by the photodiodes without being absorbed or scattered by the interconnection layer or the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photosensitive device, comprising:
an integrated circuit structure;
a first pad and a second pad exposed from a surface of the integrated circuit structure;
a first material layer disposed on the surface of the integrated circuit structure and covering the first pad;
a second material layer disposed on the first material layer and covering the second pad, wherein the first material layer and the second material layer form a photodiode; and
an anti-reflective layer disposed on the surface of the integrated circuit structure and covering the first material layer and the second material layer.

2. The photosensitive device according to claim 1, further comprising a color filter layer and a microlens disposed on the anti-reflective layer.

3. The photosensitive device according to claim 1, wherein the first material layer and the second material layer comprise two-dimensional semiconductor materials.

4. The photosensitive device according to claim 1, wherein the first material layer is P-type and the second material layer is N-type.

5. The photosensitive device according to claim 1, wherein the first material layer is N-type and the second material layer is P-type.

6. The photosensitive device according to claim 1, wherein the first material layer and the second material layer have a heterojunction formed therebetween.

7. The photosensitive device according to claim 1, wherein a top surface and a sidewall of the first material layer are covered by the second material layer.

8. The photosensitive device according to claim 1, wherein a bottom surface of the first material layer is flush with a bottom surface of the second material layer.

9. The photosensitive device according to claim 1, wherein the integrated circuit structure comprises a substrate and an interconnection layer disposed on the substrate, wherein the interconnection layer is between the substrate and the first material layer.

10. A photosensitive device, comprising:
an array region comprising a plurality of pixel units, wherein each of the pixel units comprises:
a first pad and a second pad exposed from a surface of the pixel unit;
a first material layer disposed on the surface of the pixel unit and covering the first pad;
a second material layer disposed on the first material layer and covering the second pad, wherein the first material layer and the second material layer form a photodiode; and
an anti-reflective layer disposed on the surface of the pixel unit and covering the first material layer and the second material layer.

11. The photosensitive device according to claim 10, wherein the first material layer is completely covered by the second material layer from a top view.

12. The photosensitive device according to claim 10, wherein an area of the first pad is larger than an area of the second pad from a top view.

13. The photosensitive device according to claim 10, wherein an area of the second material layer is between 70% and 100% of an area of the pixel unit.

14. The photosensitive device according to claim 10, wherein the first material layer and the second material layer comprise two-dimensional semiconductor materials.

15. The photosensitive device according to claim 10, further comprising a peripheral region surrounding the array region.

* * * * *